(12) United States Patent
Radet et al.

(10) Patent No.: US 8,686,997 B2
(45) Date of Patent: Apr. 1, 2014

(54) METHOD AND SYSTEM FOR COMPOSING AN ASSEMBLY

(75) Inventors: Emmanuel Denis Radet, Ville d'Avray (FR); Alain Georges Dugousset, Antony (FR); Juba Hadjali, Aulnay-Sous-Bois (FR)

(73) Assignee: Sassault Systemes, Velizy Villacoublay (FR)

( * ) Notice: Subject to any disclaimer, the term of this patent is extended or adjusted under 35 U.S.C. 154(b) by 967 days.

(21) Appl. No.: 12/642,276

(22) Filed: Dec. 18, 2009

(65) Prior Publication Data

US 2011/0148873 A1    Jun. 23, 2011

(51) Int. Cl.
*G06T 17/00* (2006.01)
*G09G 5/00* (2006.01)
*G06F 3/00* (2006.01)
*G06F 3/048* (2013.01)

(52) U.S. Cl.
USPC ........... 345/420; 345/630; 345/642; 715/700; 715/764

(58) Field of Classification Search
CPC ... G06F 3/0481; G06F 3/0486; G06F 9/4443; G06F 17/24; G06F 17/50; G06F 17/211; G06F 17/212; G06T 19/00; G06T 17/20; G06T 15/005; G06T 11/60; G06T 15/30; G09G 5/14; G09G 2340/0492; G09G 2340/0407
USPC ......... 345/420, 418, 419, 619, 629, 630, 642, 345/620, 649, 660; 382/154; 715/243, 246, 715/700, 764, 765, 769

See application file for complete search history.

(56) References Cited

U.S. PATENT DOCUMENTS

| 6,912,293 | B1 * | 6/2005 | Korobkin | 382/100 |
| 2002/0113784 | A1 * | 8/2002 | Feilmeier et al. | 345/419 |
| 2005/0081161 | A1 * | 4/2005 | MacInnes et al. | 715/765 |
| 2007/0159480 | A1 * | 7/2007 | Delarue et al. | 345/427 |

* cited by examiner

*Primary Examiner* — Wesner Sajous
*Assistant Examiner* — Jed-Justin Imperial
(74) *Attorney, Agent, or Firm* — Hamilton, Brook, Smith & Reynolds, P.C.

(57) ABSTRACT

The present invention provides a computer implemented method and apparatus for composing an assembly of a plurality of objects. The method comprises navigating in a PLM database and displaying 3D representations of modeled objects. The method further comprises selecting in the PLM database a plurality of the modeled objects. The method further comprises storing the selected modeled objects in an editable area. The selected modeled objects are three-dimensionally displayed in the editable area. The method further comprises composing the assembly in a scene by using at least one instance of at least one of the objects stored in the editable area.

16 Claims, 11 Drawing Sheets

METHOD AND SYSTEM FOR COMPOSING AN ASSEMBLY

BACKGROUND OF THE INVENTION

The invention relates to the field of computer programs and systems, and more specifically to computer-aided design (CAD) systems and methods.

Computer-aided techniques are known to include Computer-Aided Design or CAD, which relates to software solutions for authoring product design. Similarly, CAE is an acronym for Computer-Aided Engineering, e.g. it relates to software solutions for simulating the physical behavior of a future product. CAM stands for Computer-Aided Manufacturing and typically includes software solutions for defining manufacturing processes and operations.

A number of systems and programs are offered on the market for the design of objects (or parts) or assemblies of objects, forming a product, such as the one provided by Dassault Systèmes under the trademark CATIA. These CAD systems allow a user to construct and manipulate complex three dimensional (3D) models of objects or assemblies of objects. CAD systems thus provide a representation of modeled objects using edges or lines, in certain cases with faces. Lines or edges may be represented in various manners, e.g. non-uniform rational B-splines (NURBS). These CAD systems manage parts or assemblies of parts as modeled objects, which are mostly specifications of geometry. Specifically, CAD files contain specifications, from which geometry is generated, which in turn allow for a representation to be generated. Geometry and representation may be stored in a single CAD file or multiple ones. CAD systems include graphic tools for representing the modeled objects to the designers; these tools are dedicated to the display of complex objects—the typical size of a file representing an object in a CAD system being in the range of one Megabyte per part, and an assembly may comprise thousands of parts. A CAD system manages models of objects, which are stored in electronic files.

In computer-aided techniques, the graphical user interface (GUI) plays an important role as regards the efficiency of the technique. Most of the operations required for manipulating and/or navigating the modeled objects may be performed by the user (e.g. the designers) on the GUI. Especially, the user may create, modify, and delete the modeled objects forming the product, and also explore the product so as to comprehend how modeled objects are interrelated, e.g. via a product structure. Traditionally, these operations are carried out through dedicated menus and icons which are located on the sides of the GUI.

Also known are Product Lifecycle Management (PLM) solutions, which refer to a business strategy that helps companies to share product data, apply common processes, and leverage corporate knowledge for the development of products from conception to the end of their life, across the concept of extended enterprise. By including the actors (company departments, business partners, suppliers, Original Equipment Manufacturers (OEM), and customers), PLM may allow this network to operate as a single entity to conceptualize, design, build, and support products and processes.

Some PLM solutions make it for instance possible to design and develop products by creating digital mockups (a 3D graphical model of a product). The digital product may be first defined and simulated using an appropriate application. Then, the lean digital manufacturing processes may be defined and modeled.

The PLM solutions provided by Dassault Systemes (under the trademarks CATIA, ENOVIA and DELMIA) provides an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

Such PLM solutions comprise a relational database of products. The database comprises a set of textual data and relations between the data. Data typically include technical data related to the products said data being ordered in a hierarchy of data and are indexed to be searchable. The data are representative of the modeled objects, which are often modeled products and processes.

Product lifecycle information, including product configuration, process knowledge and resources information are typically intended to be edited in a collaborative way.

When composing an assembly of a plurality of objects, a designer typically uses objects stored in a such a PLM database. Indeed, although CAD systems allow the designer (i.e. the user of the system) to design new products from scratch, in most situations time can be saved by using objects previously designed. A designer is in that case said to "reuse" objects. The reuse of objects avoids "reinventing the wheel" each time an assembly is composed.

In current PLM systems, when a designer wants to reuse existing objects to compose a new one, he needs to first create a new empty product. The designer then uses a search function of the system to search for one or several existing products. The designer then needs to insert results of the search inside his new product, and to position them one by one. If required, the designer may run a new search operation, insert newly found products, and put them in position one by one as previously.

In these systems, to perform the search it is required that the designer enters search criteria such as keywords and/or folder name. Different objects may correspond to identical search criteria, for example if the keyword is present in their name or in their specification and/or if they are in the searched folder. The result of the search appears to the designer as a list of text references pointing at these objects.

Such a method is complex and not efficient. Indeed the designer may not input optimal keywords for the search. The result of the search is therefore not always relevant. Furthermore, such a search may lead to many text references hardly distinguishable one from the other. In the field of mechanical design especially, many parts may be designed with the same function. It may be hard for the designer to select the optimal result in such cases.

Today, on the internet, on most commercial website, user can put in a basket a selection of items he wants to order. Most of the time, this basket is displayed as a list with names and pictures of selected items. However, such functionalities do not exist in the field of computer-aided design.

Accordingly, the art of computer-aided design would benefit from the provision of a computer-implemented method for composing an assembly of a plurality of objects which renders the work of the designer easier and more efficient.

SUMMARY OF THE INVENTION

The present invention advances the art and helps to overcome the aforementioned problems by providing a computer implemented method for composing an assembly of a plurality of objects. The method comprises navigating in a PLM database and displaying 3D representations of modeled objects. The method further comprises selecting in the PLM database a plurality of the modeled objects. The method further comprises storing the modeled objects in an editable area. The selected modeled objects are three-dimensionally displayed in the editable area. The method further comprises composing the assembly in a scene by using at least one instance of at least one of the objects stored in the editable area.

Preferred embodiments comprise one or more of the following features:
- the step of composing comprises selecting in the editable area at least one of the objects displayed in the editable area;
- a plurality of instances of at least one of the objects stored in the editable area are used in the composing step;
- the user determines the number of instances of the objects stored in the editable area that are used in the composing step;
- the method further comprises navigating in the editable area, wherein the displaying of the at least one of the objects stored in the editable area is modified according to the navigating;
- the scene comprises a referential and an origin, the step of composing the assembly in the scene comprising positioning at the origin of the referential of the scene at least one instance of the object selected in the editable area;
- the scene comprises a referential, the step of composing the assembly in a scene comprising determining a position in the referential of the scene of at least one instance of the object selected in the editable area;
- the method further comprises storing a relative positioning of at least one object selected in the PLM database;
- the step of composing the assembly in a scene comprises positioning in the scene at least one instance of the object according to the relative positioning previously stored;
- the step of composing the assembly in a scene comprises the use in the scene of at least one instance of each of the objects stored in the editable area;
- the steps of navigating, selecting in the PLM database and storing are iterated;
- the editable area is embedded in the scene;
- the composing includes a drag and drop operation between the editable area and the scene;
- the method further comprises changing a state of the editable area between a hidden state and an apparent state.

The invention also provides a product lifecycle management system comprising a database storing modeled objects; and a graphical user interface. The graphical user interface is suitable for navigating in the database and displaying 3D representations of the modeled objects; selecting in the database a plurality of the modeled objects; storing the selected modeled objects in an editable area, the selected modeled objects being three-dimensionally displayed in the editable area; composing the assembly in a scene by using at least one instance of at least one of the objects stored in the editable area; according to the above method.

The invention also provides a computer readable storage medium having recorded thereon instructions for execution by a computer. The instructions comprise means for causing a product lifecycle management system comprising a database storing at least one product comprising three-dimensional modeled objects to navigate in the database and displaying 3D representations of the modeled objects; select in the database a plurality of the modeled objects; store the selected modeled objects in an editable area, the selected modeled objects being three-dimensionally displayed in the editable area; compose the assembly in a scene by using at least one instance of at least one of the objects stored in the editable area; according to the above method.

Thus, the invention offers to a designer a way to search and navigate on several existing products and then keep in an area several selections made all along this "Search+Navigate+Select" iterative process; see in 3D all the different selected products to then either visually compare them to keep and remove some of them and/or compose them in a new product.

Further features and advantages of the invention will appear from the following description of embodiments of the invention, given as non-limiting examples, with reference to the accompanying drawings listed hereunder.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows.

The teachings of all patents, published applications and references cited herein are incorporated by reference in their entirety.

Figure 1:
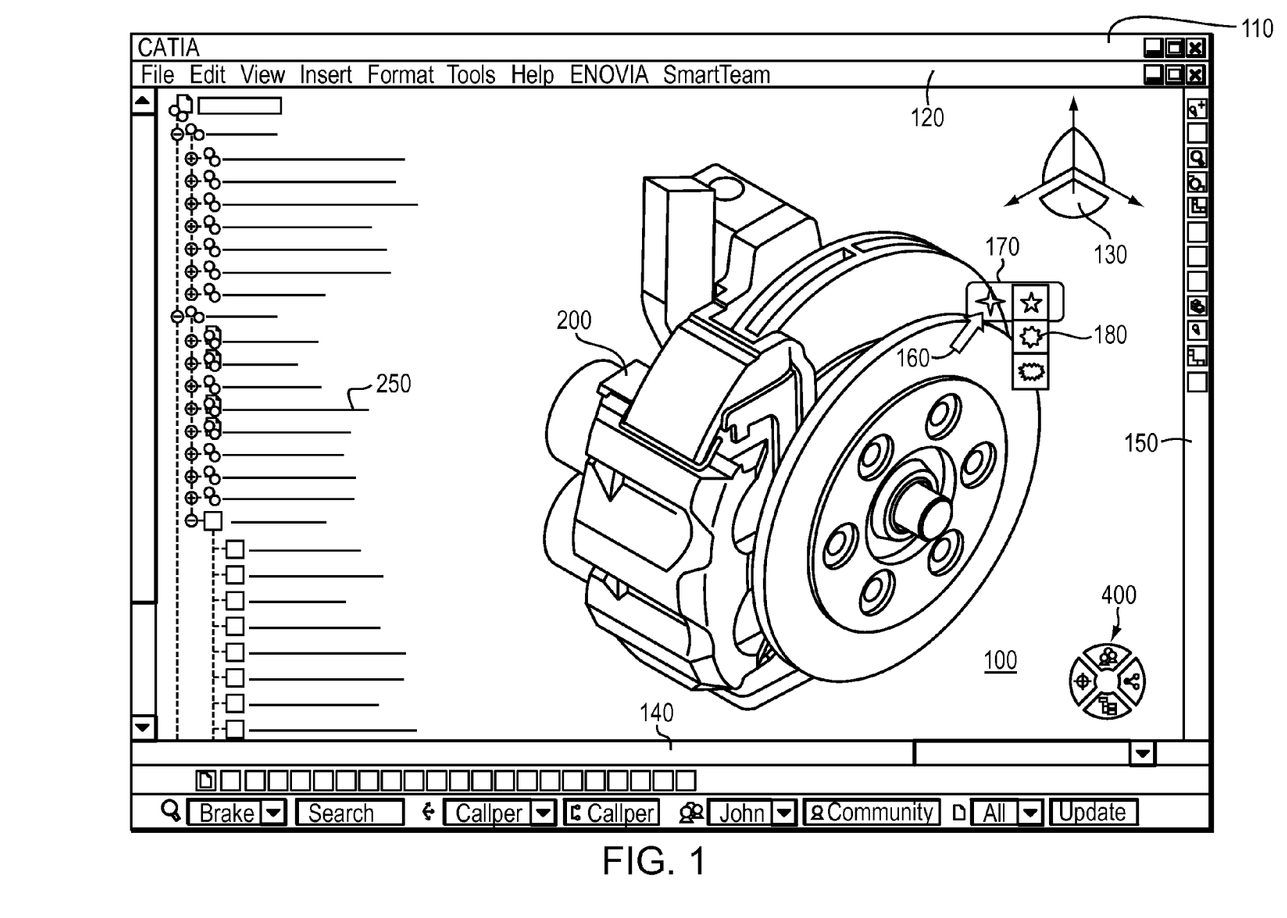
FIG. 1 is a schematic view of typical GUI in a CAD system.

In reference to FIG. 1, the exemplified graphical user interface (or GUI) 100 may be a typical CAD-like interface, having standard menu bars 110, 120, as well as bottom and side toolbars 140, 150. Such menu and toolbars contain a set of user-selectable icons, each icon being associated with one or more operations or functions, as known in the art. Some of these icons are associated with software tools, adapted for editing and/or working on a modeled product 200 or parts of product 200 such as that displayed in the GUI 100.

The software tools may be grouped into workbenches. Each workbench comprises a subset of software tools. In particular, one of the workbenches is an edition workbench, suitable for editing geometrical features of the modeled product 200. In operation, a designer may for example pre-select a part of the object 200 and then initiate an operation (e.g. change the dimension, color, etc.) or edit geometrical constraints by selecting an appropriate icon. For example, typical CAD operations are the modeling of the punching or the folding of a 3D modeled object displayed on the screen.

In addition, the one or more operations or function may be selected directly nearby the modeled product 200 or parts of product 200 displayed in the GUI 100. To this aim, a user-selectable icon 170 associated with operations or functions may appear near a selector 160, e.g. the cursor of a haptic device such as a mouse. The user may pass the cursor 160 over the phylactery 170 which, in response, displays a set of icons 180. Typically, the user-selectable icons 170, 180 may have the form of a phylactery. Then the user selects one of the icons of the set of icons 180 in order to perform a function associated with said selected icon. Furthermore, the set of icons 180 behave semantically, that is, the set of icons 180 is suggested by the CAD system according to the operation the user is supposed to have in mind.

The GUI may for example display data 250 related to the displayed product 200. In the example of FIG. 1, the data 250, displayed as a "feature tree", and their 3D representation 200 pertain to a brake assembly including brake caliper and disc. The GUI may further show various types of graphic tool 130,160, for example for facilitating 3D orientation of the object, for triggering a simulation of an operation of an edited product or render various attributes of the displayed product 200.

The invention provides a computer implemented method for composing an assembly of a plurality of objects which may be performed with the aid of any of the aforementioned systems. The method comprises navigating in a PLM database and displaying 3D representations of modeled objects. The method further comprises selecting in the PLM database a plurality of the modeled objects. The method further comprises storing the modeled objects in an editable area. The selected modeled objects are three-dimensionally displayed in the editable area. The method further comprises composing the assembly in a scene by using at least one instance of at least one of the objects stored in the editable area. Such a method renders the work of the designer easier and more efficient.

Figure 2:
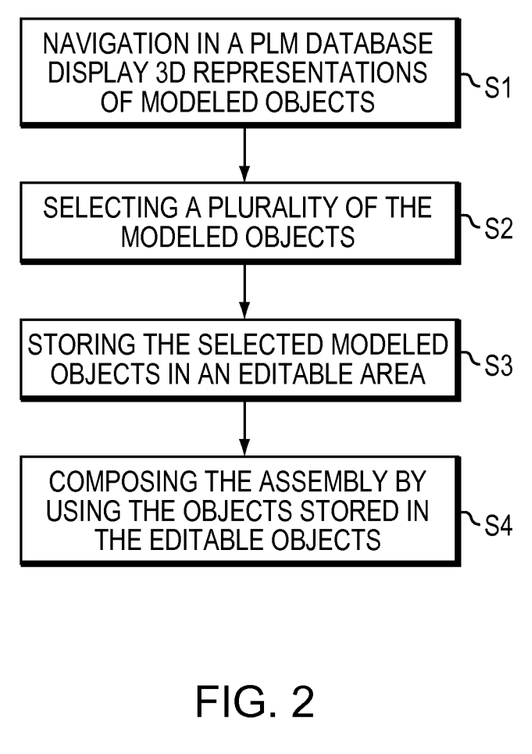
FIG. 2 is a flowchart of a method for composing an assembly of a plurality of objects.

A chart of such a method is provided in FIG. 2. Typically, the method is performed with a GUI as exemplified in FIG. 1.

The method is intended for composing an assembly of a plurality of objects. Such an assembly may model a part, or a product. The term "part" generally refers to a mechanical component of an industrial product. In that case, each object of the assembly may correspond to a constituent of the part. However, many variations are possible and within the scope of the invention. For example, the assembly of objects may also model an assembly of parts, possibly an entire industrial product (e.g. a wheel of a car). In that case, some of the objects may correspond to whole parts, or to assembly of constituents of parts. Furthermore, the invention is not solely intended to the design of mechanical parts, but it is applicable to any field where computer design is required. For example, the invention is applicable to the field of video games.

The method comprises a step (S1) of navigating in a PLM database and displaying 3D representations of modeled objects. The modeled objects may typically be displayed on a screen. The objects are modeled by geometrical specifications that allow their display in 3D. An object being displayed in 3D allows its viewing from all angles. For example, the object may be handled and turned around any of its axes, or around any axis in the screen. This notably excludes 2D icons, which are not 3D modeled.

When composing the assembly of objects with the method, a designer may first launch a system or software suitable for composing the assembly, typically a CAD system. The designer may then model these objects using CAD techniques as known from prior art, e.g. by providing geometrical and topological specifications. However, as explained earlier, the designer may prefer to "reuse", i.e. import, objects previously modeled by him or by collaborators. This allows him to save a lot of time and to design parts with higher speed and efficiency. Navigation in the PLM database permits to scrawl all the modeled objects which are available for reuse in the composing of the assembly. The displaying of 3D representations of modeled objects provides the designer with the optimal visualization of the modeled objects. However, 2D representations may alternatively or additionally be displayed.

The method may further comprise a step (S2) of selecting in the PLM database a plurality of the modeled objects. The method may further comprise a step (S3) of storing the selected modeled objects in an editable area.

An editable area is an area of a screen that a user may graphically edit. It is possibly delimited so that it is more easily recognizable by the user. Modeled objects may be stored in an editable and assembled in an editable manner. In other words, the designer may modify the way modeled objects are displayed in the editable area. Providing such functionalities allows the user to arrange objects stored in the editable area in a user-friendly manner. Selecting a plurality of objects and storing them in an editable area allows the designer to have a stock, or "basket", of objects which are ready to be reused for the composition of the assembly.

The selected modeled objects are three-dimensionally displayed in the editable area. This way, the designer visualizes three-dimensional representations of all the objects which are at his disposal for reuse. A three-dimensional representation of an object provides the designer with the ability to recognize easily the object represented. This is particularly useful for speed and efficiency in CAD. Because the area is editable, the user may navigate and arrange the modeled objects at will. This way, the user may recognize the objects that he needs with higher speed and efficiency.

The method may further comprise a step (S4) of composing the assembly in a scene by using at least one instance of at least one of the objects stored in the editable area. After the navigation of the database, the selection of objects of the database and storage of the selected objects, the designer typically launches a composition application for composing an assembly. Alternatively, he may switch from a navigating mode of an application, used for the previous steps of the method, to a composition mode of the same application. In any case, the designer uses a scene for composing the assembly.

A scene is an area of the screen where a representation of the assembly under composition is displayed. The scene is a concept known from prior art. It is the area where the designer works on the assembly. When composing the assembly, the scene and the editable area may be simultaneously displayed to the designer. This way, the designer may see at the same time the assembly being composed as well as the objects at his disposal. The editable area may be embedded in the scene. This makes the use of the editable area more ergonomic. Alternatively, the editable area may be distinct from the scene.

Additionally, the method may comprise changing a state of the editable area between a hidden state and an apparent state. The designer may then be able to expand the editable area so that it is displayed only when he needs it.

The scene may be wider than the editable area. In other words, more screen space may be allocated to the scene than to the editable area. Indeed, the designer mainly works on the scene. He needs to access the editable area mainly at the time he wants to reuse an object stored in the editable area. However, the editable area's size may be increasable.

The editable area may offer the same edition and navigation functionalities to the designer as the scene does. For instance, displays in both the editable area and the scene may be zoomed in or out, rotated, objects may be re-arranged, etc. . . . . The functionalities include functionalities known from prior art in addition to the ones detailed in the U.S. application Ser. No. 12/638,228 entitled "Method and System for editing a Product Assembly" filed on Dec. 15, 2009 by assignee, which is incorporated herein by reference. Examples of functionalities of the referenced application are provided below with reference to the figures. For performance purpose however, the editable area may be provided with less functionalities than the scene.

In the following, different examples of performing the method are detailed with reference to the figures.

Figure 3:
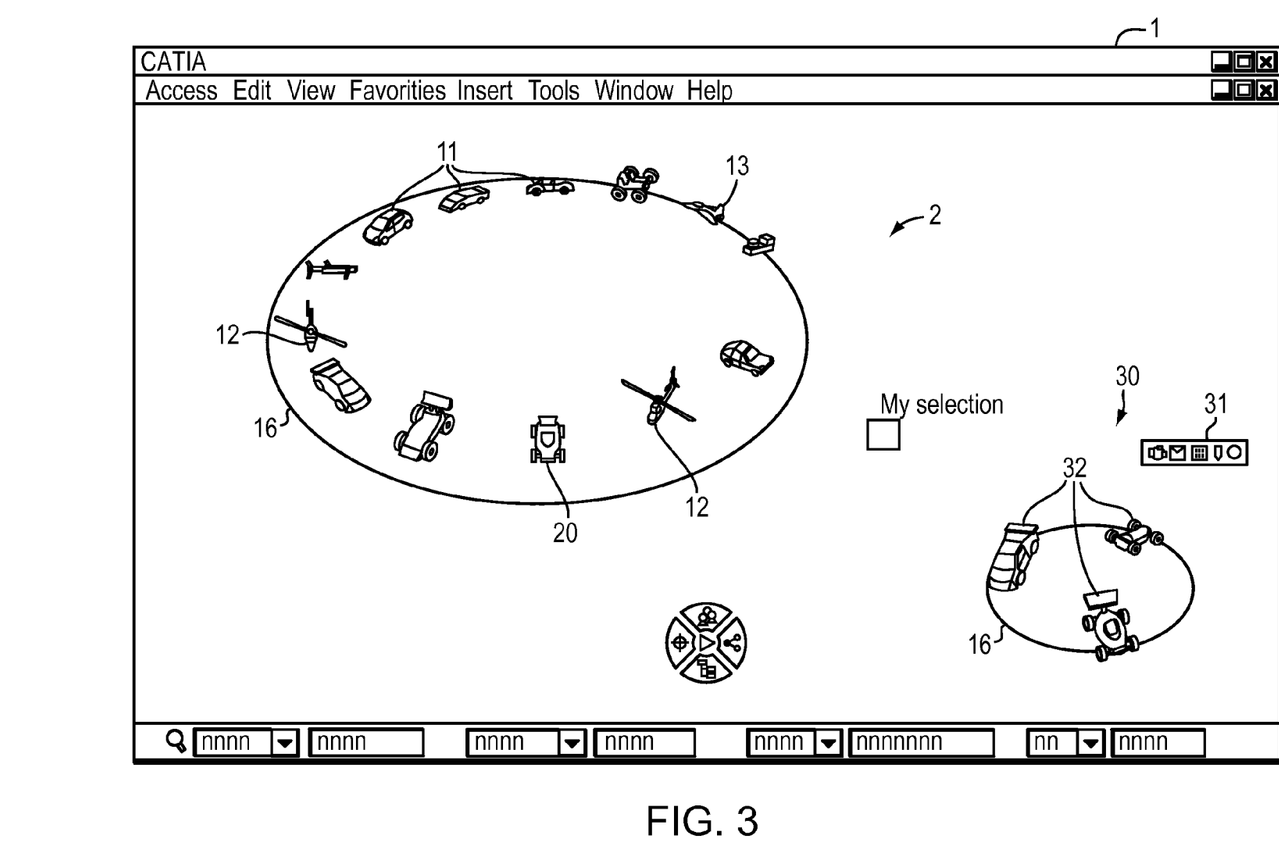
FIGS. 3-10 are graphical representations of steps of a method for composing an assembly of a plurality of objects.
Figure 4:
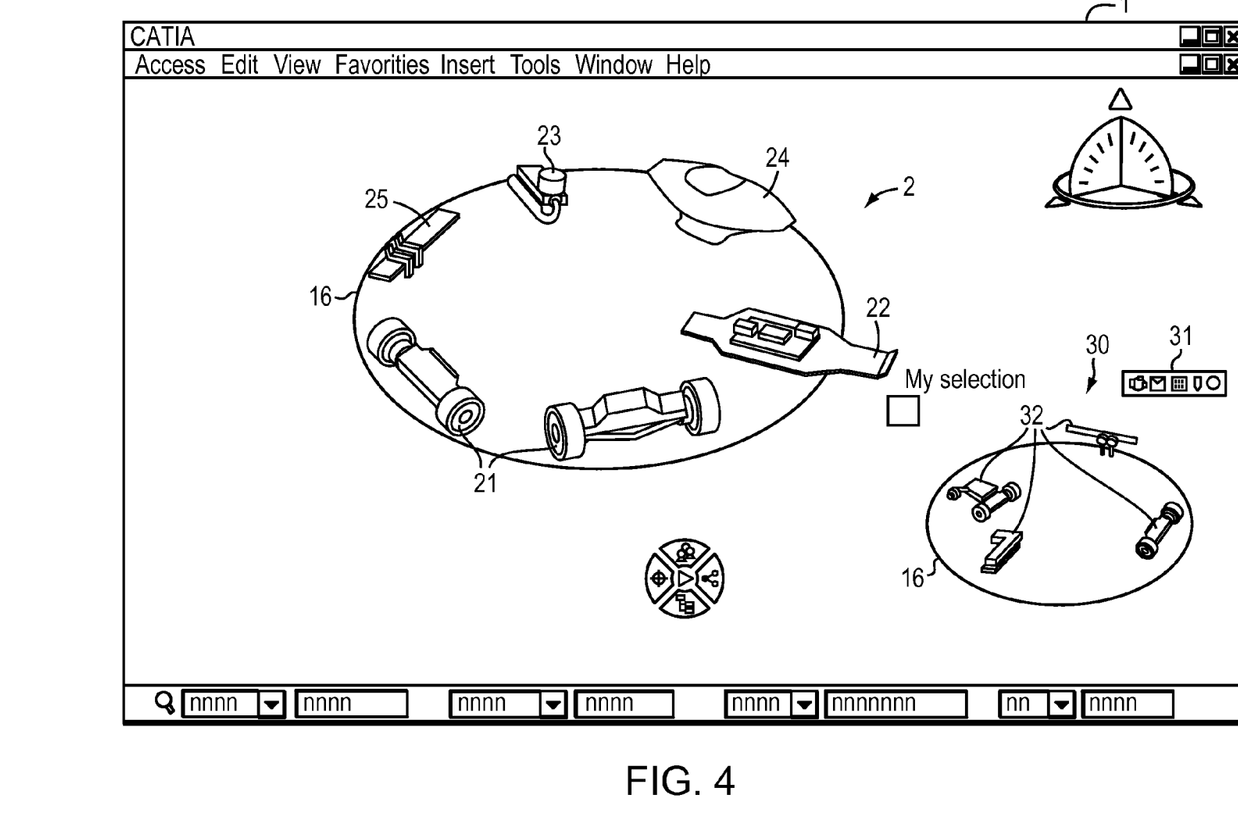

FIG. 3 and FIG. 4 exemplify the step of navigating in a PLM database and displaying 3D representations of modeled objects. FIGS. 3 and 4 each show a different view 2 of the database in a navigation window 1. In the case of FIG. 3, the objects of the database are vehicles such as cars 11, helicopters 12, or planes 13. FIG. 4 represents a view of one car 20 selected from the vehicles represented in FIG. 3. In the view 2 of FIG. 4, 3D representations of modeled axles 21, chassis 22, motor 23, body 24 and spoiler 25 of modeled car 20 are displayed.

When navigating in a database, a designer may access to different views at different levels of details. FIG. 3 represents a view at the level of products. FIG. 4 represents a view at the level of constituents of the products. Thus, FIG. 4 represents a view at a higher level of details than FIG. 3. Passage from a view to another may be achieved by using functionalities of the navigation known from the prior art or from US application entitled "Method and System for editing a Product Assembly" (e.g. double clicking on an object, clicking on a specific button of the navigation window 1, etc). For instance, the user may be navigating in a database where elements are represented using turntables 16. Turntables are graphical elements which may be rotated and zoomed and on which objects in the databases are represented. For more details on turntables, it is referred to U.S. patent application Ser. No. 11/312,804 entitled "Method and System for graphically navigating among stored Objects", which is incorporated herein by reference.

FIGS. 3 and 4 further show an editable area 30. In this example, the editable area is reducible through clicking on button 31. In this example, the editable area 30 is embedded in the navigation window 1. As mentioned earlier, the editable area 30 may be an area separate from the navigation window 1. The editable area 30 may also use turntables 16.

The method may further comprise selecting (S2) in the PLM database a plurality of the modeled objects 32 and storing (S3) the selected modeled objects in an editable area. The selected modeled objects 32 are three-dimensionally displayed in the editable area 30 represented in FIGS. 3 and 4. The objects may be selected and stored in the editable area 30 by a "drag and drop" operation of the designer. A "drag and drop" operation is an operation in which the user drives the graphical representation of an object, for example through haptic movement, from one location of the screen to another. Alternatively to a drag and drop operation, the objects may be first selected by a first operation of the designer, and then stored in the editable area by a second operation.

The steps of navigating (S1), selecting (S2) and storing (S3) may be iterated. Notably, different objects represented in a view may be selected successively and finally stored in the editable area. Alternatively, the steps of selecting (S2) and storing (S3) may be iterated. Furthermore, different views of the database may be accessed through the iteration of the step of navigating (S1), each time leading to the selection (S2) and the storage (S3) of one or more objects. This last possibility is illustrated by FIGS. 5-8.

Figure 5:
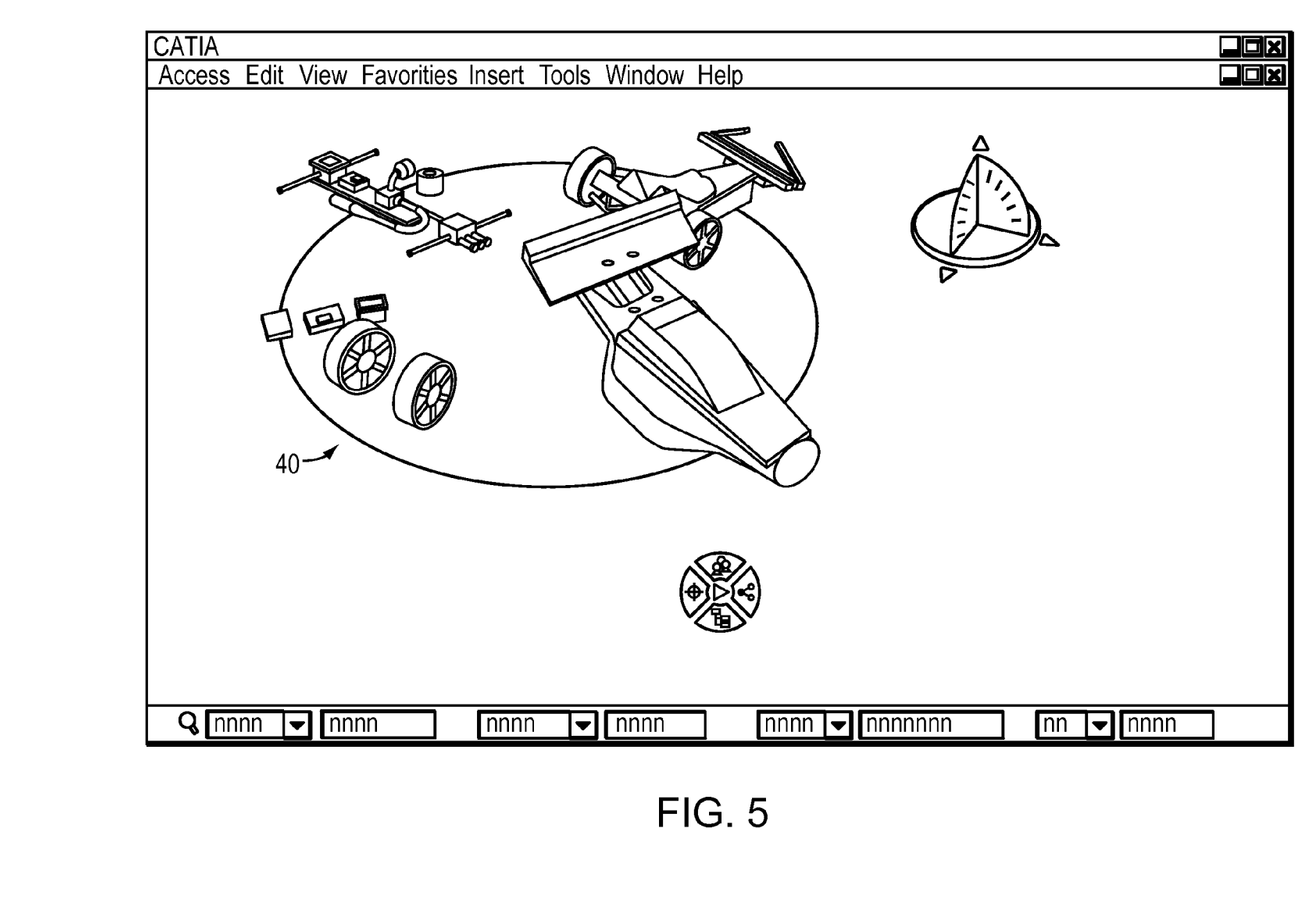

FIG. 5 illustrates the navigation (S1) in the database and a view of a first product 40. After the editable area 30 is opened, and objects 41 are selected and stored in the editable area 30.

Figure 6:
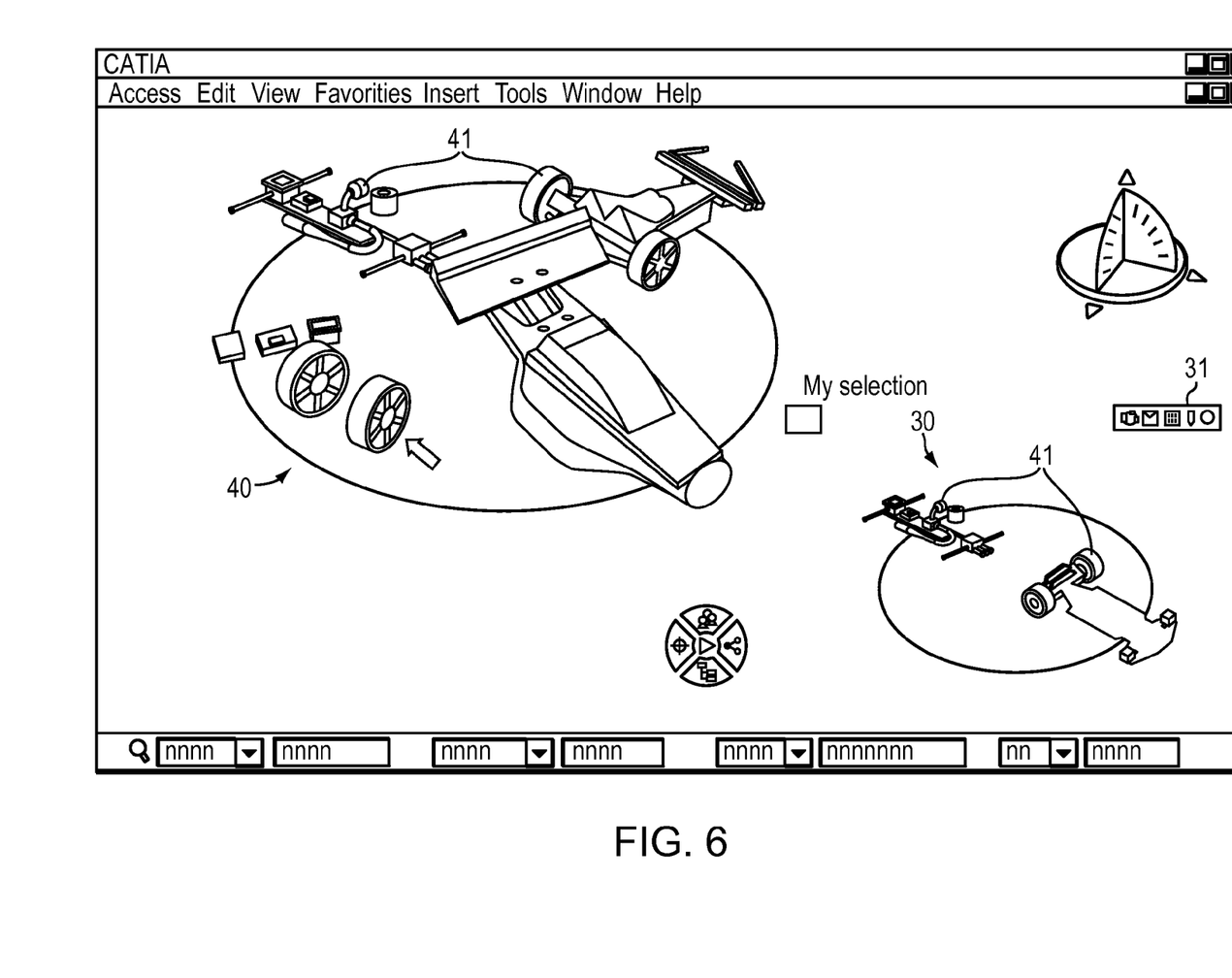
Figure 7:
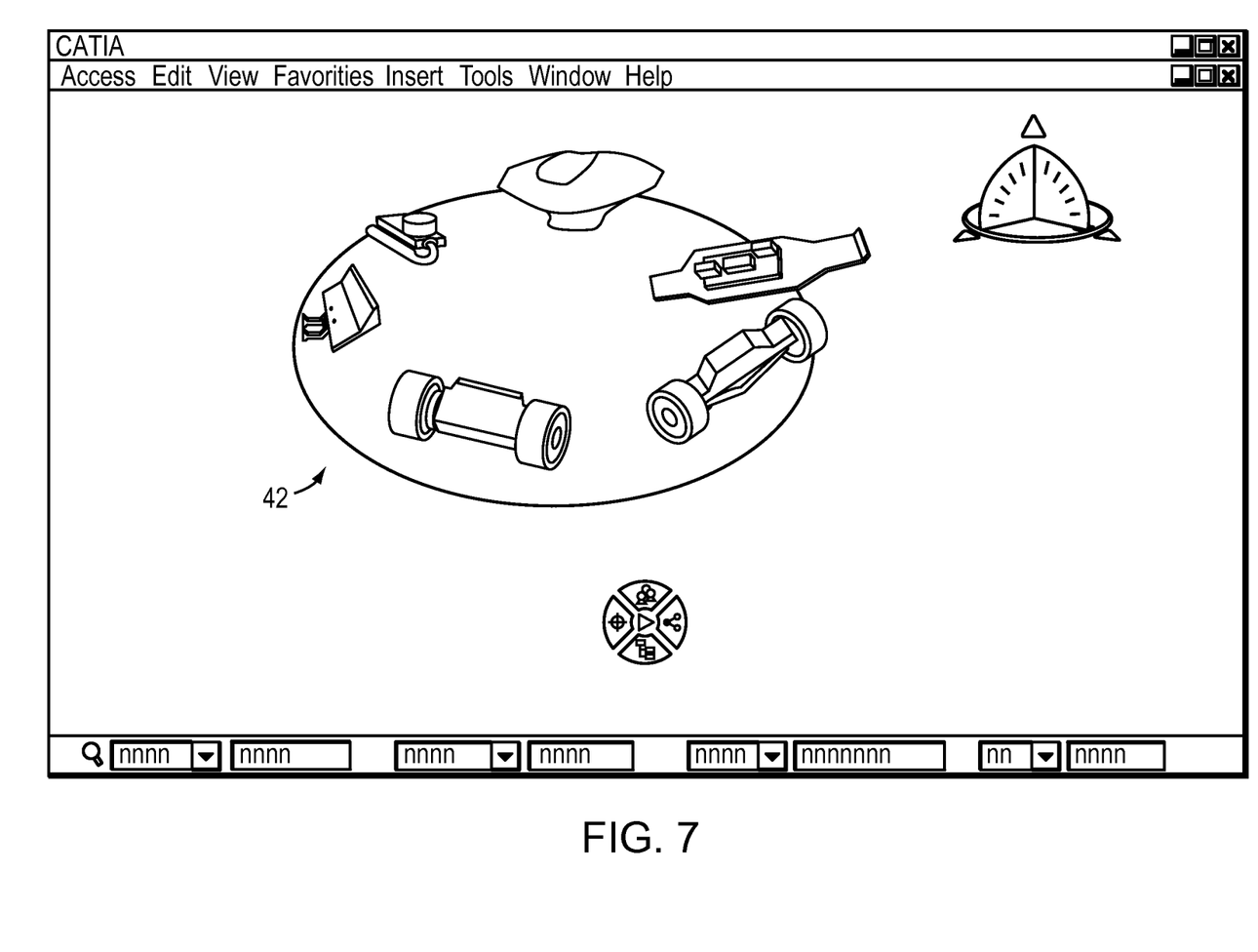
Figure 8:
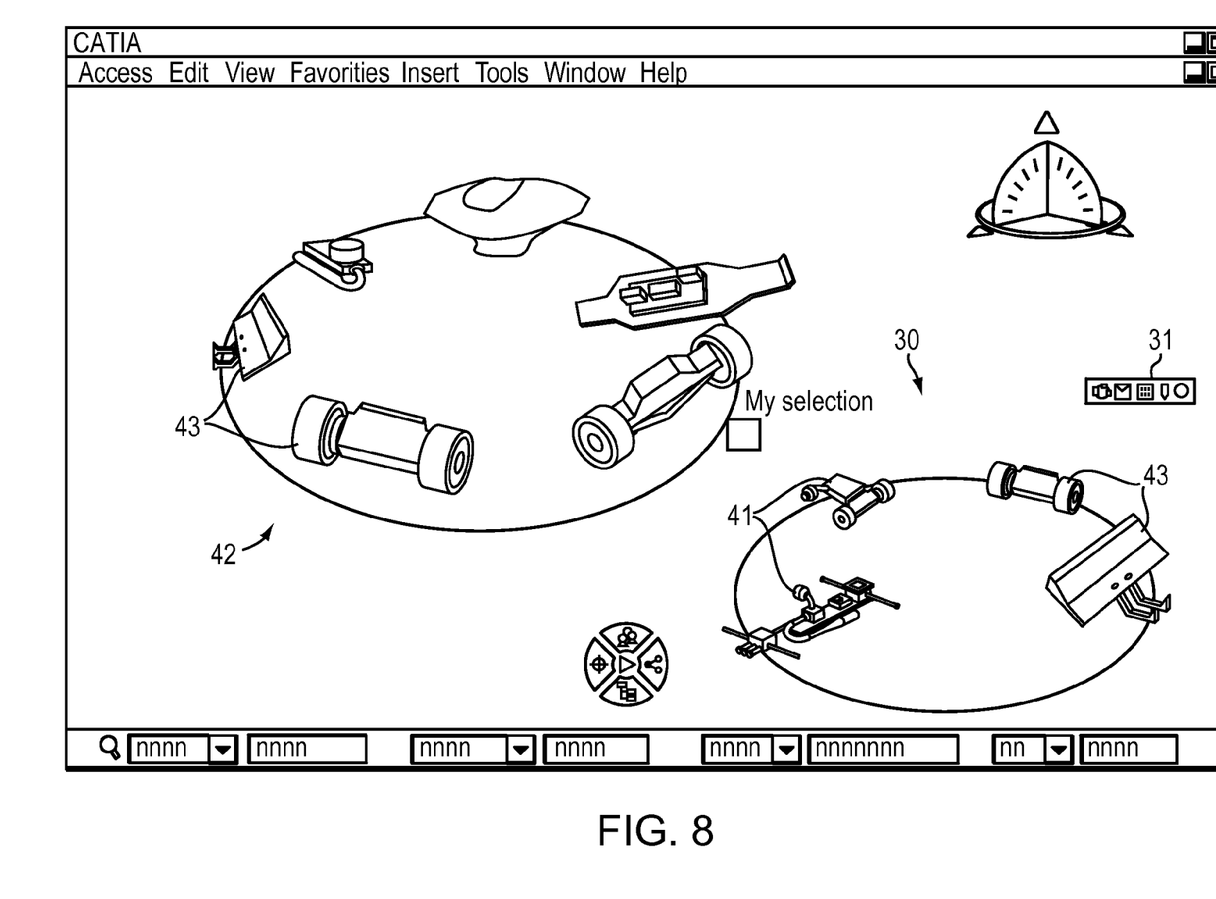

The result is shown in FIG. 6. The navigation may then lead to changing the view, and for example accessing a view of a second product 42, as represented in FIG. 7. Again, objects 43 may be selected (S2) and stored (S3) in the editable area 30. The result is shown in FIG. 8.

Using the editable area 30 so constituted, the user may compose the assembly of objects. For that, the method may comprise navigating in the editable area, wherein the displaying of the at least one of the objects stored in the editable area is modified according to the navigating.

The step of composing may comprise selecting in the editable area at least one of the objects displayed in the editable area. As the user may navigate in the editable area, accordingly modifying the display of the editable area, such a selection is rendered easy to perform. Indeed, the user may rotate the turntables of the editable area, as mentioned earlier, thereby moving the focus from one stored object to another. The user may zoom in or out. The user may access different levels of details of the objects stored in the editable area. All these capacities provided to the user make the selection of an object stored in the editable area easier to perform.

At least one instance of the object selected in the editable area may then be used to compose the assembly. This may be achieved by a drag and drop operation between the editable area and the scene. This may be achieved by any other means. With a drag and drop operation, one instance of the object may be included to the assembly. Alternatively, several instances of the same object may be included in the assembly. This may be achieved by providing the user with the ability to determine the number of instances of the objects stored in the editable area that are used in the composing step. For example, after a drag and drop of the object, a field may be presented to the user in which a number may be entered to determine the number of instances of the said object which are to be included in the assembly. Alternatively, the user may press a key value even though no field is presented. Such functionality enables the user to design the assembly considerably faster. For example, the user may store one wheel of a car in the editable area and still use four instances of the wheel, in only one operation, to design another car. Time is saved and design is more efficient.

The scene may comprise a referential and an origin. For example, three axes (x,y,z) defining the referential and one point O defining the origin (0,0,0) coordinate may be set. The step of composing the assembly in the scene may then comprise positioning at the origin of the referential of the scene the at least one instance of the object selected in the editable area. Alternatively, the user may use a drag and drop operation to position the at least one instance at another position. The drag and drop may also be used after the at least one instance is positioned at the origin.

These may correspond to a default behaviour proposed by the system, to which an advanced behaviour may be added. In the advanced behaviour, the user may determine a position in the referential of the scene where the at least one instance of the object selected in the editable area is to be placed. The method may also comprise storing a relative positioning of the objects selected in the PLM database. At the step of composing the assembly, the positioning in the scene of at least one instance of the object may be performed according to the relative positioning previously stored. This way, the user may take advantage not only of design information of previously designed objects, but also of positioning information of such objects.

For example, the relative positioning may comprise the positioning of an object A relatively to another object B. Let us consider now that a user is designing an assembly already comprising object B, and that he wants to include object A, which is stored in the editable area, in the assembly. The system may offer the possibility to the user to position A according to its positioning relative to B. Thus time is saved to the user who does not need to define such a positioning once again.

Figure 9:
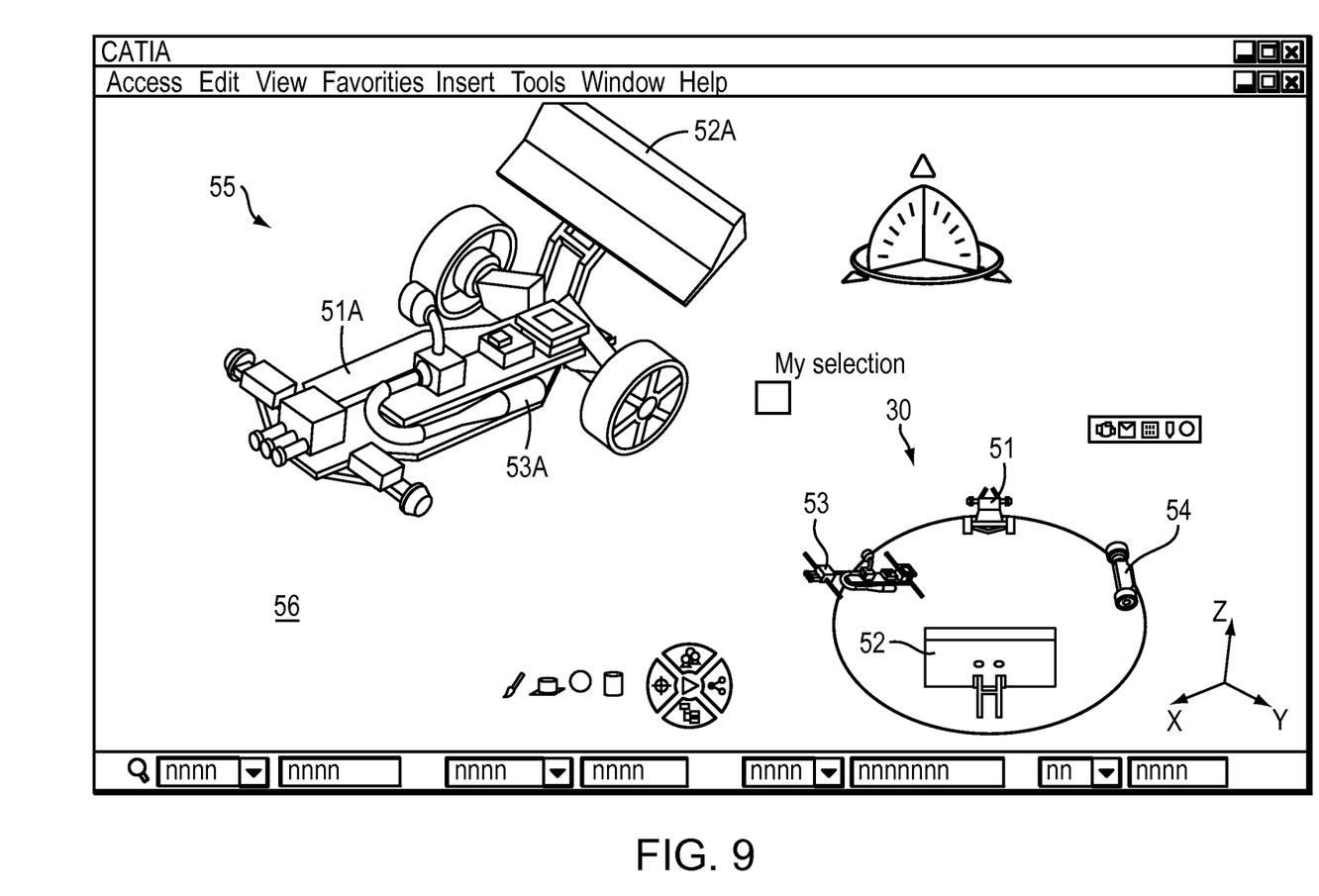
Figure 10:
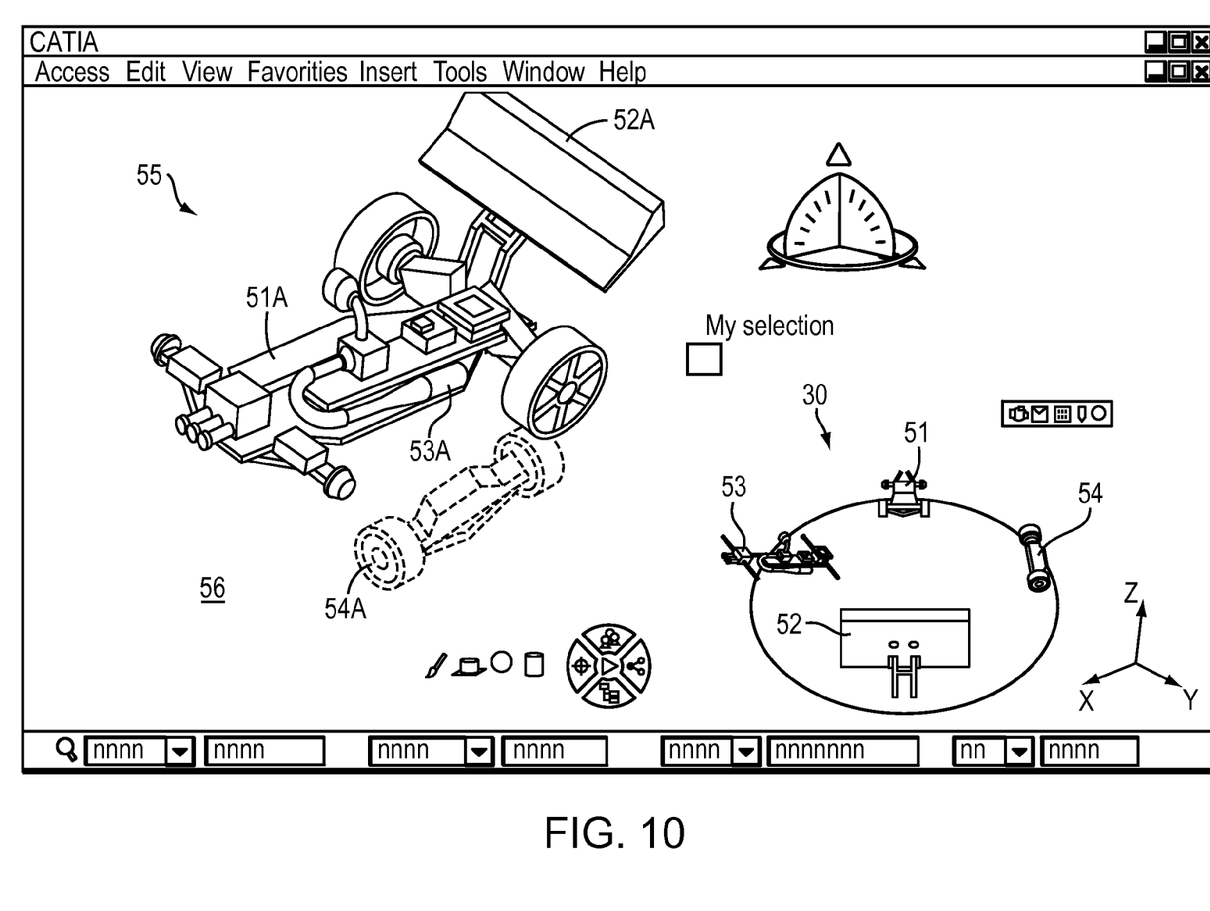

FIGS. 9 and 10 illustrate the composition (S4) of the assembly in the scene by using at least one instance of at least one of the objects stored in the editable area.

With reference to FIG. 9, the user has stored in the editable area 30 a chassis 51, a spoiler 52, a motor 53, an axle 54. The designer is composing an assembly 55 in a scene 56. The assembly comprises one instance 51A of the chassis 51, one instance 52A of the spoiler 52, and one instance 53A of the motor 53. The designer now wishes to add the axle 54. For that, as explained above, the designer may perform a drag-and-drop operation from the editable area 30 to the scene 56 or any equivalent operation. The result of such an operation is represented in FIG. 10 by the translucent view of an instance 54A of axle 54. In the example of FIG. 10, the instance 54A is positioned at the origin of a referential, which is here below the representation of the assembly. As mentioned earlier, the designer may move the representation of instance 54A of an axle 54 to another position, rotate it. Alternatively, the instance may be directly positioned at a previously stored relative positioning. Moreover, instead of one instance of axle 54, several instances of axle 54 may be added to the assembly, upon user determination and/or stored information. All the alternatives and functionalities mentioned above may actually be applied to this example.

The method may also comprise a step of composing the assembly in a scene and comprises the use in the scene of at least one instance of each of the objects stored in the editable area. In other words, all the objects stored in the editable area are used once in the assembly. This may be ensured by a specific action provided by the system, for example clicking on a specific icon. This functionality allows very fast design. It is particularly useful when a designer wants to compose an assembly of subassemblies. This may be the case when arriving at the end of the process of designing a product. In that case, specialist designers have already designed the subassemblies and stored them in a PLM database. The designer responsible for the whole project may then store such subassemblies in the editable area according to the method by navigating in the PLM database. The project is at an advanced state and the designer knows what he needs to compose the assembly. The probability that he has stored "useless" objects in the editable area is thus very low. Instead of adding such stored subassemblies one by one, the designer may thus benefit from adding the objects at once, because none or few objects in the editable area would later need to be deleted.

The editable area allows a user to keep selected products, to see them in 3D and then to compose them in a new or an existing product.

The main advantages of the method are, non-exhaustively, its ease of use, its being fully 3D (although 2D thumbnails are also available), and its consistence with existing systems.

The method may be implemented on both navigation and authoring environments. Indeed, a product lifecycle management system may comprise a database storing modeled object and a graphical user interface suitable for performing the above method upon user actions.

A computer readable storage medium may also have recorded thereon instructions for execution by a computer, the instructions comprising means for causing a product lifecycle management system comprising a database storing at least one product comprising three-dimensional modeled objects to perform the above method upon user actions.

Such a system may be supported on hardware. The database may be stored in at least one memory location of such hardware. The system comprises a processor. The graphical user interface may include a screen for displaying and a tool for a designer to make the processor perform action, based on different instructions contained in the memory. This tool is typically a haptic tool, such as a mouse, or a touch screen.

Figure 11:
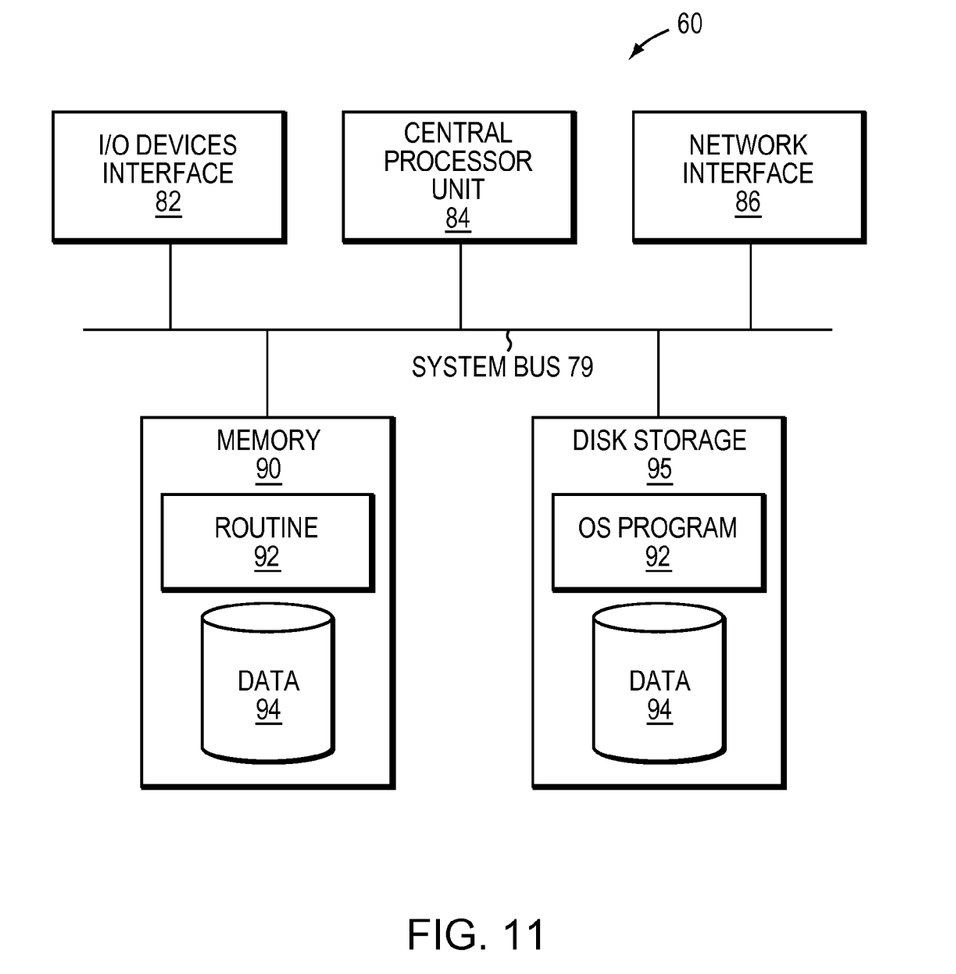
FIG. 11 is a block diagram of a computer implementing the invention method of FIG. 2.

For example, embodiments of the present invention may be implemented on a computer 60 as in FIG. 11. Computer 60 contains system bus 79, where a bus is a set of hardware lines used for data transfer among the components of a computer or processing system. Bus 79 is essentially a shared conduit that connects different elements of a computer system (e.g., processor, disk storage, memory, input/output ports, network ports, etc.) that enables the transfer of information between the elements. Attached to system bus 79 is I/O device interface 82 for connecting various input and output devices (e.g., keyboard, mouse, displays, printers, speakers, etc.) to the computer 60. Network interface 86 allows the computer to connect to various other devices attached to a network (e.g., the internet). Memory 90 provides volatile storage for computer software instructions 92 and data 94 used to implement an embodiment of the present invention (e.g., editable area 30, method of FIG. 2 and code for composing an assembly of objects detailed above). Disk storage 95 provides non-volatile storage for computer software instructions 92 and data 94 used to implement an embodiment of the present invention. Central processor unit 84 is also attached to system bus 79 and provides for the execution of computer instructions.

In one embodiment, the processor routines 92 and data 94 are a computer program product (generally referenced 92), including a computer readable medium (e.g., a removable storage medium such as one or more DVD-ROM's, CD-ROM's, diskettes, tapes, etc.) that provides at least a portion of the software instructions for the invention system. Computer program product 92 can be installed by any suitable software installation procedure, as is well known in the art. In another embodiment, at least a portion of the software instructions may also be downloaded over a cable, communication and/or wireless connection. In other embodiments, the invention programs are a computer program propagated signal product embodied on a propagated signal on a propagation medium (e.g., a radio wave, an infrared wave, a laser wave, a sound wave, or an electrical wave propagated over a global network such as the Internet, or other network(s)). Such carrier medium or signals provide at least a portion of the software instructions for the present invention routines/program 92.

In alternate embodiments, the propagated signal is an analog carrier wave or digital signal carried on the propagated medium. For example, the propagated signal may be a digitized signal propagated over a global network (e.g., the Internet), a telecommunications network, or other network. In one embodiment, the propagated signal is a signal that is transmitted over the propagation medium over a period of time, such as the instructions for a software application sent in packets over a network over a period of milliseconds, seconds, minutes, or longer. In another embodiment, the computer readable medium of computer program product 92 is a propagation medium that the computer system 60 may receive and read, such as by receiving the propagation medium and identifying a propagated signal embodied in the propagation medium, as described above for computer program propagated signal product.

Generally speaking, the term "carrier medium" or transient carrier encompasses the foregoing transient signals, propagated signals, propagated medium, storage medium and the like.

The invention has been described with reference to preferred embodiments. However, many variations are possible within the scope of the invention. For example, the invention was mainly described with reference to the field of mechanical engineering. However, the invention applies to the field of Systems engineering in general, in particular 3D for Systems or Space Allocation Mock-up management. The invention also applies to any field where an assembly of a plurality of objects may be composed, such as video games. Accordingly, the scope of the present invention is intended to embrace all such alternatives, modifications, and variations together with all equivalents thereof.

While this invention has been particularly shown and described with references to example embodiments thereof, it will be understood by those skilled in the art that various changes in form and details may be made therein without departing from the scope of the invention encompassed by the appended claims.

What is claimed is:

1. A computer implemented method for composing an assembly of a plurality of objects comprising:
    in a navigation mode of operation:
    navigating, by processor, in a Product Lifecycle Management (PLM) database and displaying three-dimensional (3D) representations of modeled objects, the objects having been previously modeled with respect to an assembly and being available for reuse in other assemblies;
    selecting in the PLM database a plurality of the modeled objects, the selected modeled objects of the plurality enabling composing of a subject assembly; and
    storing the selected modeled objects in an editable area, the selected modeled objects being three-dimensionally displayed in the editable area in a manner available for use and re-use in composing the subject assembly wherein the editable area is capable of the same edition and navigation functionalities of a scene used in a composition mode; and
    switching from the navigation mode to the composition mode, and in the composition mode:
    composing the subject assembly in the scene by using at least one instance of at least one of the selected model objects stored in the editable area, wherein the editable area in the navigation mode is a same area as the editable area in the composition mode, and the editable area and the subject assembly in the scene of the composition mode being simultaneously and adjacently displayed when composing the subject assembly.

2. The method according to claim 1, wherein the step of composing comprises selecting in the editable area at least one of the objects displayed in the editable area.

3. The method according to claim 2, wherein a plurality of instances of at least one of the objects stored in the editable area are used in the composing step.

4. The method according to claim 3 further comprising, determining the number of instances of the objects stored in the editable area that are used in the composing step.

5. The method according to claim 2 further comprising:
    navigating in the editable area,
    wherein the displaying of the at least one of the objects stored in the editable area is modified according to the navigating.

6. The method according to claim 2 wherein the scene comprises a referential and an origin, the step of composing the subject assembly in the scene comprising positioning at the origin of the referential of the scene at least one instance of the object selected in the editable area.

7. The method according to claim 2 wherein the scene comprises a referential, the step of composing the subject assembly in the scene comprising determining a position in the referential of the scene of at least one instance of the object selected in the editable area.

8. The method according to claim 1, further comprising storing a relative positioning of at least one object selected in the PLM database.

9. The method according to claim 8 wherein the step of composing the subject assembly in the scene comprises positioning in the scene at least one instance of the object according to the relative positioning previously stored.

10. The method according to claim 1, wherein the step of composing the subject assembly in the scene comprises the use in the scene of at least one instance of each of the objects stored in the editable area.

11. The method according to claim 1, wherein the steps of navigating, selecting in the PLM database and storing are iterated.

12. The method according to claim 1 wherein the editable area is embedded in the scene.

13. The method according to claim 12, wherein the composing includes a drag and drop operation between the editable area and the scene.

14. The method according to claim 12, further comprising changing a state of the editable area between a hidden state and an apparent state.

15. A product lifecycle management system comprising:
    a processor;
    a database storing modeled objects, the objects having been previously modeled with respect to an assembly and being available for re-use in other assemblies; and
    a graphical user interface suitable for:
    in a navigation mode:
    navigating in the database and displaying three-dimensional (3D) representations of the modeled objects;
    selecting in the database a plurality of the modeled objects, the selected modeled objects of the plurality enable composing of a subject assembly;
    storing the selected modeled objects in an editable area, the selected modeled objects being three-dimensionally displayed in the editable area, in a manner available for use and re-use in composing the subject assembly wherein the editable area is capable of the same edition and navigation functionalities of a scene used in a composition mode; and
    in the composition mode:
    composing the subject assembly in the scene by using at least one instance of at least one of the selected model objects stored in the editable area, the editable area in the navigation mode being a same area as the editable area in the composition mode, and the editable area and the subject assembly in the scene at the composition mode being simultaneously and adjacently displayed during composing the subject assembly.

16. A non-transitory computer readable storage medium having recorded thereon instructions for execution by a computer, the instructions comprising means for causing a product lifecycle management system comprising a database storing at least one product comprising three-dimensional modeled objects to:

in a navigation mode:
navigate in the database and display three-dimensional (3D) representations of the modeled objects, the objects having been previously modeled with respect to an assembly and being available for re-use in other assemblies;
select in the database a plurality of the modeled objects, the selected modeled objects of the plurality enabling composing of a subject assembly;
store the selected modeled objects in an editable area, the selected modeled objects being three-dimensionally displayed in the editable area in a manner available for use and re-use in composing the subject assembly wherein the editable area has the same edition and navigation functionalities of a scene to be used in a composition mode; and
in the composition mode:
compose the subject assembly in the scene by using at least one instance of at least one of the selected model objects stored in the editable area, wherein the editable area in the navigation mode being a same area as the editable area in the composition mode, and the editable area and the subject assembly in the scene of the composition mode being simultaneously and adjacently displayed during composing the subject assembly.

* * * * *

UNITED STATES PATENT AND TRADEMARK OFFICE
CERTIFICATE OF CORRECTION

PATENT NO. : 8,686,997 B2  
APPLICATION NO. : 12/642276  
DATED : April 1, 2014  
INVENTOR(S) : Emmanuel Denis Radet, Alain Georges Dugousset and Juba Hadjali Page 1 of 1

It is certified that error appears in the above-identified patent and that said Letters Patent is hereby corrected as shown below:

Title page, item (73) Assignee: Delete "Sassault Systemes, Velizy Villacoublay" and replace it with --Dassault Systemes, Velizy-Villacoublay--

Signed and Sealed this  
Seventeenth Day of June, 2014

Michelle K. Lee  
*Deputy Director of the United States Patent and Trademark Office*